United States Patent [19]

Shioya et al.

[11] Patent Number: 4,906,593
[45] Date of Patent: Mar. 6, 1990

[54] METHOD OF PRODUCING A CONTACT PLUG

[75] Inventors: Yoshimi Shioya, Yokohama; Yuji Furumura, Kawasaki; Yasushi Ohyama, Kodaira; Shin-ichi Inoue, Kawasaki; Tsutomu Ogawa, Machida; Kiyoshi Watanabe, Kuwana; Hiroshi Goto, Yokohama, all of Japan

[73] Assignee: Fujitsu Limited, Kawasaki, Japan

[21] Appl. No.: 166,832

[22] Filed: Mar. 4, 1988

Related U.S. Application Data

[63] Continuation of Ser. No. 16,073, Jan. 27, 1987, abandoned, which is a continuation of Ser. No. 739,231, May 30, 1985, abandoned.

[30] Foreign Application Priority Data

Jun. 2, 1984 [JP] Japan ................. 59-112219
Jun. 29, 1984 [JP] Japan ................. 59-135444

[51] Int. Cl.$^4$ .................. H01L 21/283; H01L 21/20
[52] U.S. Cl. .................. 437/192; 437/193; 437/203; 148/DIG. 20; 148/DIG. 26
[58] Field of Search ............. 437/192, 200, 193, 195, 437/203, 245; 357/67 S, 71 S; 148/DIG. 20, DIG. 26

[56] References Cited

U.S. PATENT DOCUMENTS

| | | | |
|---|---|---|---|
| 3,717,514 | 2/1973 | Burgess | 148/175 |
| 4,343,676 | 8/1982 | Tarng | 156/628 |
| 4,378,383 | 3/1983 | Moritz | |
| 4,392,298 | 7/1983 | Banker et al. | 29/577 G |
| 4,517,225 | 5/1985 | Broadbent | 427/89 |
| 4,532,702 | 8/1985 | Gigante et al. | 29/578 |
| 4,540,607 | 9/1985 | Tsao | 427/253 |

FOREIGN PATENT DOCUMENTS 0068897 1/1983 European Pat. Off.

OTHER PUBLICATIONS

Tsao et al, *J. Electro Chem. Soc*, Nov. 1984, pp. 2702-2708.
Morosami et al, *Thin Solid Films*, vol. 52, No. 2, Jul. 1978, pp. 181-194.
Shaw et al, *RCA Review*, Jun. 1970, pp. 307-316.
Metz et al., *Appl. Phys. Lett.*, vol. 44, No. 12, Jun. 15, 1984, pp. 1139-1141.
Moriya et al, IEEE *IEDM Technical Digest 1983*, pp. 550-553.
Voss et al, IEEE *IEDM Technical Digest* 1983, pp. 35-38.
Endo et al, IEEE *IEDM Technical Digest*, 1983, pp. 31-34.
Mastroianni, *Solid State Technology*, May 1984, pp. 155-161.

*Primary Examiner*—Brian E. Hearn
*Assistant Examiner*—T. N. Quach
*Attorney, Agent, or Firm*—Staas & Halsey

[57] ABSTRACT

A method of producing a semiconductor device comprising the steps of: forming a window or contact hole in an insulating layer to expose a portion of a semiconductor substrate or a lower conductor line; forming semiconductor material (silicon) in the window; substituting the material with a metal (tungsten) by reaction of the semiconductor material with a metal compound ($WF_6$ gas); and forming a conductor line over the metal within the window.

11 Claims, 3 Drawing Sheets

METHOD OF PRODUCING A CONTACT PLUG

This is a continuation of application Ser. No. 016,073 filed on Jan. 27, 1987, now abandoned, which is a continuation of application Ser. No. 739,231 filed on May 30, 1985, now abandoned.

BACKGROUND OF THE INVENTION

The present invention relates to a production of a semiconductor device. More particularly, it relates to a method of forming an interconnecting structure between a conductor line and a doped region of a silicon substrate (or another lower conductor line) through a contact hole formed in an insulating layer.

The density or integration of semiconductor devices such as ICs has been increased, and accordingly, an area of a semiconductor substrate in contact with an electrode has become smaller than in the prior art and/or a conductor multilayer structure has been adopted. In the former case, a window (i.e., contact hole) is formed in an insulating layer formed on the semiconductor substrate, and in the latter case, a contact hole is formed in an insulating layer formed between the upper and lower conductor lines. In both cases the contact hole is made smaller, therefore the ratio of the opening width to the hole depth becomes smaller, making the side of the hole steeper. When a conductor layer (e.g., a commonly used aluminum layer) is deposited on the insulating layer so that it will connect with the semiconductor substrate or the lower conductor line, step coverage defects, such as breakdown or a very thin portion formation at the edge of a contact hole and the generation of deep crack inside the contact hole occur.

To prevent the occurrence of these step coverage defects, the contact hole only is filled with silicon (in this case, the silicon is doped to provide it with a certain conductivity) to obtain a flat surface at the insulating layer and the filled silicon. Thereafter a conductor layer of, e.g., aluminum, is deposited on the flat surface in such a manner that no step coverage defects occur. The filling of a contact hole only with silicon is carried out by (1) a method of selectively epitaxial growing silicon or (2) a method comprising the steps of vapor depositing polycrystalline silicon on the whole surface and selectively etching the portion on the insulating layer except within the contact hole. The first method is disclosed in, for example, N. Endo et al: "CMOS Technology Using Isolation Technique", IEEE Int. Electron Devices Meeting, Tech. Dig., pp. 31–34 (1983) and H. J. Voss, H. Kürten: "Device Isolation Technology by Selective Low-Pressure Silicon Epitaxy", IEEE Int. Electron Devices Meeting, Tech. Dig., pp. 35–38 (1982). In the second method, the polycrystalline silicon is formed by a conventional chemical vapor deposition (CVD) method and is used as a material for silicon gates of MOSFETs, conductive lines, etc. Such single crystalline or polycrystalline silicon is doped to a resistivity of $4-6 \times 10^{-4}$ ohm.cm. The contact hole size, i.e., a crosssectional area of the filled silicon, is made smaller, so that a resistance of the filled silicon within the contact hole is increased. This increase in the resistance causes an increase in the delay time of the signal transmission.

The use of a refractory metal instead of silicon can reduce the delay time of the signals, since the refractory metal, such as tungsten (W), molybdenum (Mo) and the like has a lower resistivity than that of doped silicon by more than one order. A planar process in which a contact hole is filled with tungsten by a CVD method is disclosed in, e.g., T. Moriya et al: "A Planar Metallization Process—its Application to Tri-Level Aluminum Interconnection", IEEE Int. Electron Devices Meeting Tech. Dig., pp. 550–553 (1983). In this case, however, disadvantages occur in that the deposition rate of the tungsten is low (about 4.7 nm/min in the method as described later) so that the deposition time for filling the contact hole is long and that tungsten may be deposited on an insulating layer of $SiO_2$. Moreover, the present inventors found that it is difficult to obtain good reproducibility when forming a contact hole in an insulating layer having a thickness of about 1.0 μm, and selectively filling the contact hole with tungsten by a CVD method.

SUMMARY OF THE INVENTION

An object of the present invention is to provide a method of filling a contact hole with refractory metal in a shorter period and with better reproducibility as compared with the prior art.

Another object of the present invention is to provide a method of forming a conductor layer without allowing step coverage defects to occur.

The above-mentioned and other objects of the present invention are attained by providing a method of producing a semiconductor device, which method comprises the steps of: forming a contact hole (i.e., a window or via hole) in an insulating layer to expose a conducting portion (i.e., a semiconductor substrate or a lower conductor line); filling the contact hole with a semiconductor material; substituting the filled semiconductor material with a metal by making a metal compound react with the semiconductor material; and forming a conductor line (i.e., an interconnection) on the metal within the contact hole and on the insulating layer.

The semiconductor material formed in the contact hole is silicon in a single crystalline, polycrystalline, or amorphous state.

Preferably, the silicon within the contact hole is substituted with tungsten by reacting the silicon with a tungsten hexafluoride ($WF_6$) gas at a temperature of 300° C. to 350° C.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Figure 1A:
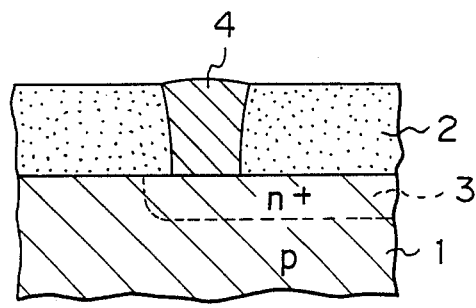
FIGS. 1A and 1B are partial sectional views of a semiconductor device in various stages of production in accordance with the method of the present invention.

Referring to FIG. 1A, an insulating layer 2 of, e.g., phosphosilicate glass (PSG), is formed on a semiconductor substrate 1, i.e., a silicon wafer, by a CVD method. The insulating layer 2 may be made of silicon dioxide (SiO$_2$) formed by thermally oxidizing the silicon substrate 1. The insulating layer 2 is selectively etched by a suitable lithography method to form a window (i.e., a contact hole) in which a portion of a doped region 3 of the semiconductor substrate 1 is exposed. The window is then filled with a silicon filler 4 formed by a suitable conventional method, so as to form a substantially flat surface of the insulating layer 2 and the silicon filler 4.

It is possible to make the silicon filler 4 of single crystalline silicon, polycrystalline silicon or amorphous silicon. To fill the window with single crystalline silicon, the silicon is selectively epitaxially grown on the exposed surface of the semiconductor substrate 1 in the contact hole by exposing the substrate 1 to a reduced pressure SiH$_2$Cl$_2$ (or SiHCl$_3$)-H$_2$-HCl system gas at a temperature of 900° C. to 1000° C. To fill the window with polycrystalline silicon, a polycrystalline silicon layer is formed in the window and on the insulating layer (i.e., on the whole exposed surface) by a reduced pressure CVD method, a resist layer having a flat surface is formed on the silicon layer, and the resist layer and the silicon layer are then etched by a dry etching method which can etch both layers at substantially the same etching rates so as to leave a portion of the silicon layer within the window only. To fill the window with amorphous silicon, an amorphous silicon layer is formed on the whole exposed surface by a SiH$_4$ gas glow discharge decomposition method and a portion of it left within the window only in a manner similar to that used in the case of polycrystalline.

The semiconductor substrate 1 having the silicon filler 4 is set in a CVD device and is heated at a temperature of from 300° C. to 350° C. A WF$_6$ gas together with a carrier gas (of N$_2$) is introduced into the CVD device. Thus the silicon of the filler 4 is substituted with tungsten by the following reaction.

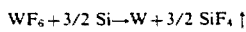

$$WF_6 + 3/2\ Si \rightarrow W + 3/2\ SiF_4 \uparrow$$

It is preferable to maintain the inside pressure of the CVD device at a reduced pressure. It is possible to maintain the inside pressure at an atmospheric pressure.

Where the amorphous silicon is formed by the glow discharge decomposition method, it contains hydrogen which accelerates the substitution of tungsten in the following reaction.

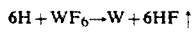

$$6H + WF_6 \rightarrow W + 6HF \uparrow$$

Figure 1B:
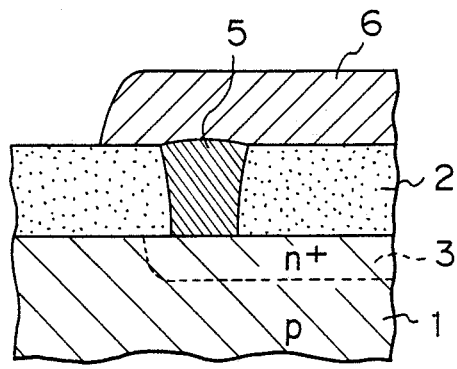

Thus a tungsten filler 5 is obtained, as shown in FIG. 1B. Next, a conductor line (i.e., a metal interconnection) 6 of aluminum is formed on the tungsten filler 5 and the insulating layer 2, in such a manner that the conductor line 6 is electrically connected with the doped region 3 through the tungsten filler 5.

Figure 2A:
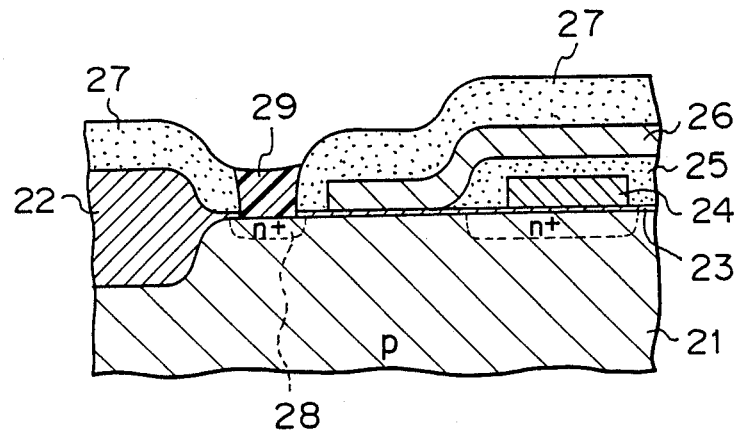
FIGS. 2A and 2B are partial sectional views of a one-transistor cell for a dynamic random-access memory integrated circuit in various stages of production in accordance with the method of the present invention.
Figure 2B:
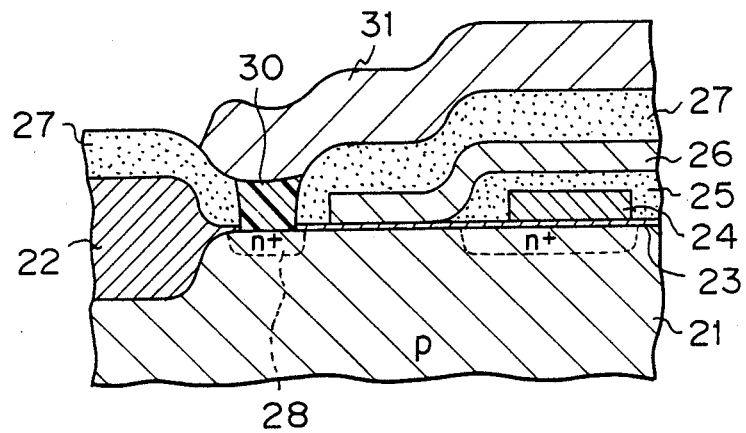

As shown in FIGS. 2A and 2B, a contact electrode of a one-transistor cell in a dynamic random-access memory integrated circuit can be formed in accordance with the method of the present invention. In accordance with a conventional production method of a one-capacitor one transistor cell, a silicon substrate 21 is selectively oxidized to form a field oxide layer (a thick SiO$_2$ layer) 22 and is then slightly oxidized to form a gate oxide layer of a thin SiO$_2$ layer 23. A capacitor electrode 24 of polycrystalline silicon is formed on the gate oxide layer 23. Then a first insulating layer 25 of, e.g., PSG, is formed so as to cover the capacitor electrode 24. A transfer gate electrode 26 of polycrystalline silicon is formed on the gate oxide layer 23 and the first insulating layer 25. A second insulating layer 27 of, e.g., PSG, is formed on the whole surface by a CVD method. A window (i.e., contact hole) is formed by selectively etching the second insulating layer 27 and the gate oxide layer 23 by a conventional lithography technique (e.g., a photo-etching method), so that a doped region 28 serving as a bit line in the silicon substrate 21 is exposed to the window. According to the present invention, the window is filled with a silicon filler 29. In this case, prior to the formation of a silicon layer including the filler 29, a resist layer (not shown) used in the lithography technique is left on the second insulating layer 27. Then a polycrystalline or single crystalline silicon layer is formed within the window and on the resist layer by a plasma CVD method or a sputtering method. When the resist layer is removed by a suitable solvent, the silicon layer portion on the resist layer is also removed by a so-called lift-off method.

The substrate 21 having the silicon filler 29 is heated at a temperature of from 300° C. to 350° C. while exposed to a WF$_6$ gas of N$_2$, and a carrier gas, so that the silicon is substituted with tungsten. Thus a tungsten filler 30 (FIG. 2B) is obtained. Finally, a conductor line (metal interconnection) 31 of, e.g., aluminum, is formed on the tungsten filler 30 and the second insulating layer 27 by a conventional method.

As shown in FIGS. 3A to 3D, the method of the present invention can be applied to a multilayer interconnection structure of a semiconductor device.

Figure 3A:
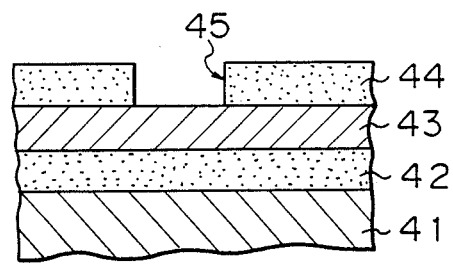
FIGS. 3A through 3D are partial sectional views of a semiconductor device having a multilayer interconnection structure in various stages of production in accordance with the method of the present invention.

As shown in FIG. 3A, a first insulating layer 42 of, e.g., SiO$_2$, is formed on a semiconductor substrate 41, i.e., a silicon wafer. A first (lower) conductor line 43, e.g., an aluminum layer having a thickness of about 1 μm, is formed on the first insulating layer 42. The conductor line 43 is connected with the substrate 41 through a contact hole in the insulating layer 42 at a suitable position (not shown). Then a second insulating layer 44 of, e.g., PSG, is formed on the first conductor line 43 and on the first insulating layer 42 not covered by the conductor line 43 by a CVD method. The second insulating layer 44 is selectively etched by a conventional lithograph technique to form a contact hole 45.

Figure 3B:
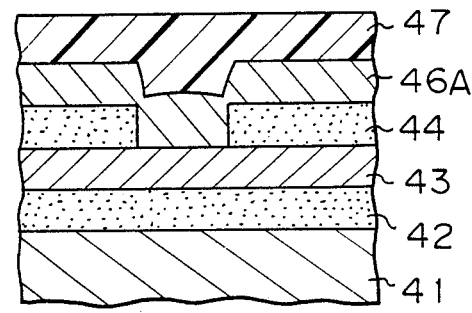

As shown in FIG. 3B, first, an alumina (Al$_2$O$_3$) generally formed on the exposed surface of the aluminum first conductor line 43 by oxidation is removed by a plasma etching method using an etchant gas of, e.g., nitrogen trifluoride (NF$_3$), and then a polycrystalline silicon layer 46A is formed in the contact hole and on the second insulating layer 44 by a plasma CVD method using a monosilane (SiH$_4$) gas. The conditions for the CVD are, e.g., RF power (13.56 MHz) of 30 W, minimum reduced pressure before starting of 1 Torr, SiH$_4$ of 10 cc/min, and substrate temperature of 100°-200° C. The deposited silicon layer 46A has a thickness of about 1 μm.

It is possible to form the silicon layer 44 of amorphous silicon by a sputtering method. In this case, the above-mentioned alumina is removed by sputter-etching prior to the deposition of the amorphous silicon.

Figure 3C:
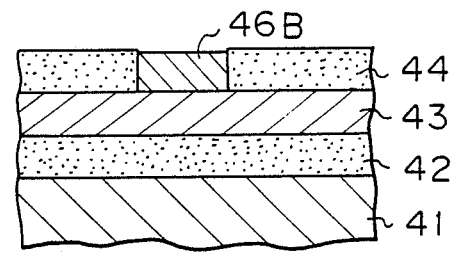
Figure 3D:
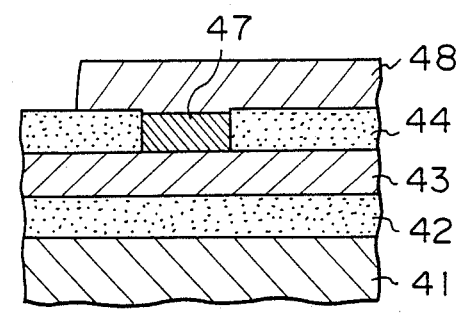

Then a resist layer 47 is applied on the whole surface to fill the recess above the contact hole and obtain a flat surface thereof. The resist layer 47 and the silicon layer 46A are simultaneously etched by a suitable dry etching method in which the etch rate of the used resist is substantially equal to that of the silicon. As a result a silicon filler 46B (FIG. 3C) remains in the contact hole and the silicon layer on the second insulating layer 44 is removed, as shown in FIG. 3C. Such dry etching is a plasma etching process carried out under the following conditions, e.g., RF power (13.56 MHz) of 200 W, minimum reduced pressure before the introduction of the etchant gas of 0.3 Torr, and a mixed gas of carbon tetrafluoride ($CF_4$) and oxygen ($O_2$) in the ratio of 10:1.

Next the silicon filler 46B is substituted with tungsten by exposing the obtained substrate to a mixed gas of $WF_6$ gas and a diluent gas of nitrogen ($N_2$) in the ratio of 1:20, which flows into a CVD device after it is evacuated to 0.2 Torr. Thus a tungsten filler 47 (FIG. 3 D) is obtained.

Finally, a second conductor line 48 of, e.g., aluminum, is formed on the tungsten filler 47 and the second insulating layer 48.

EXAMPLE

A PSG layer having a thickness of 1 μm was formed on a silicon wafer by a CVD method. The PSG layer was selectively etched to form a contact hole or window having a diameter of about 1.5 μm. A single crystalline silicon was then selectively grown within the contact hole only under the following conditions:

Wafer temperature: 950° C.
Pressure: 50 Torr
Flow rate of $SiH_2Cl_2$: 200 cc/min
Flow rate of $H_2$: 50 l/min Next the obtained silicon wafer was set in a CVD device in which the silicon within the contact hole was substituted with tungsten under the following conditions:

Vacuum in CVD device: 0.2 Torr
Wafer temperature: 325° C.
Flow rate of $WF_6$: 30 cc/min
Flow rate of carrier gas ($N_2$): 400 cc/min
Treating time: 20 min.

As a result, the tungsten containing silicon was obtained in the contact hole, and the tungsten had a resistivity of about $4 \times 10^{-5}$ ohm.cm. The obtained tungsten and the PSG layer formed a substantially flat surface.

An aluminum conductor line was formed on the tungsten in the contact hole and the PSG layer without the occurrence of step-coverage defects.

It will be obvious that the present invention is not restricted to the above-mentioned embodiments and that many variations are possible for persons skilled in the art without departing from the scope of the invention. For example, it is possible to use a molybdenum tetrafluoride ($MoF_4$) gas instead of a $WF_6$ gas. In this case, the silicon within a contact hole is substituted with molybdenum.

We claim:

1. A method for preparing a semiconductor device comprising:
   providing a semiconductor device having a conducting portion;
   forming an insulating layer on said device in covering relationship to said conducting portion;
   forming a contact hole in said insulating layer to expose said conducting portion;
   filling said contact hole with a silicon material;
   contacting the silicon material in the contact hole with a metal compound capable of reacting with silicon to form a metal, said metal thereby depositing in said hole to fill the latter and provide an electrical connection through said insulating layer for the conducting portion; and
   forming a line of conducting material on said insulating layer and on the metal deposited in the hole, said metal in the hole thereby electrically interconnecting the line and the conducting portion.

2. A method as set forth in claim 1, wherein said metal compound comprises tungsten hexafluoride gas whereby said metal comprises tungsten.

3. A method as set forth in claim 2, wherein said contacting is caused to occur at a temperature in the range of 300° C. to 350° C.

4. A method as set forth in claim 1, wherein said contact hole is formed to have a diameter of about 1.5μ.

5. A method as set forth in claim 1, wherein said insulating layer is formed from a material comprising PSG.

6. A method as set forth in claim 5, wherein said contact hole is formed to have a diameter of about 1.5μ.

7. A method as set forth in claim 1, wherein said insulating layer is formed to have a thickness of about 1μ.

8. A method as set forth in claim 7, wherein said contact hole is formed to have a diameter of about 1.5μ.

9. A method as set forth in claim 8, wherein said insulating layer is formed from a material comprising PSG.

10. A method as set forth in claim 1, wherein the metal filling the contact hole and the insulating layer present a substantially flat surface.

11. A method as set forth in claim 1, wherein said metal compound comprises molybdenum tetrafluoride whereby said metal comprises molybdenum.

* * * * *

UNITED STATES PATENT AND TRADEMARK OFFICE
CERTIFICATE OF CORRECTION

PATENT NO. : 4,906,593
DATED : March 6, 1990
INVENTOR(S) : YOSHIMA SHIOYA et al.

It is certified that error appears in the above-identified patent and that said Letters Patent is hereby corrected as shown below:

Column 1, line 59, "ohm.cm" should be --ohm·cm--.

Column 3, line 37, "(of $N_2$)" should be --of $N_2$--.

Column 5, line 42, "ohm.cm" should be --ohm·cm--.

Signed and Sealed this

Fourteenth Day of May, 1991

Attest:

HARRY F. MANBECK, JR.

*Attesting Officer*　　*Commissioner of Patents and Trademarks*